(12) United States Patent
Toleno et al.

(10) Patent No.: US 11,304,334 B2
(45) Date of Patent: Apr. 12, 2022

(54) VAPOR CHAMBER HAVING AN ELECTROMAGNETIC SHIELDING LAYER AND METHODS OF MANUFACTURING THE SAME

(71) Applicant: Microsoft Technology Licensing, LLC, Redmond, WA (US)

(72) Inventors: Brian J. Toleno, Cupertino, CA (US); Erin Elizabeth Hurbi, San Francisco, CA (US); Michael Nikkhoo, Saratoga, CA (US); Tzu-Yuan Lin, San Jose, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 338 days.

(21) Appl. No.: 16/009,129

(22) Filed: Jun. 14, 2018

(65) Prior Publication Data

US 2019/0387642 A1    Dec. 19, 2019

(51) Int. Cl.
*H05K 7/20* (2006.01)
*H05K 9/00* (2006.01)
*H01Q 21/00* (2006.01)

(52) U.S. Cl.
CPC ..... *H05K 7/20309* (2013.01); *H01Q 21/0087* (2013.01); *H05K 9/00* (2013.01)

(58) Field of Classification Search
CPC .. H05K 7/20309; H05K 9/00; H01Q 21/0087; H01L 23/427; F28F 19/06;
(Continued)

(56) References Cited

U.S. PATENT DOCUMENTS 5,590,346 A * 12/1996 West .............. G06F 1/1626
455/348
5,861,873 A * 1/1999 Kikinis ............ G06F 1/1626
345/157

(Continued)

OTHER PUBLICATIONS

"International Search Report and Written Opinion Issued in PCT Application No. PCT/US19/035909", dated Sep. 19, 2019, 16 Pages.

*Primary Examiner* — Stephen S Sul
(74) *Attorney, Agent, or Firm* — Newport IP, LLC; Jacob P. Rohwer

(57) ABSTRACT

A vapor chamber includes an electromagnetic (EM) shielding layer. The vapor chamber is constructed from a structural base material that provides for a suitable size, strength, and/or weight for a specific application. The vapor chamber is treated at the region(s) to provide suitable EM shielding characteristics for the specific application. For example, an oxidation layer is removed from the region(s) to expose the structural base material while the vapor chamber is in an inert environment that prevents further oxidation. Then, while the vapor chamber remains within the same inert environment, a material having suitable electrical conductive properties is deposited onto the exposed structural base material to form an EM shielding layer at the region(s). When the vapor chamber is installed into an electronic device, the EM shielding layer may be electrically grounded so as to isolate one or more components within the electronic device from EM signal interference.

20 Claims, 6 Drawing Sheets

(58) Field of Classification Search
CPC .. F28F 19/004; F28D 15/02; G06F 2200/201; G06F 1/203; G06F 1/20
USPC .......................... 361/679.52, 704, 818, 720
See application file for complete search history.

(56) References Cited

U.S. PATENT DOCUMENTS

| | | | | |
|---|---|---|---|---|
| 7,295,441 | B1* | 11/2007 | Laio | H01L 23/427 165/80.3 |
| 8,934,235 | B2* | 1/2015 | Rubenstein | F28D 15/0275 361/679.47 |
| 10,103,087 | B2* | 10/2018 | Jin | H01L 23/3737 |
| 2002/0067598 | A1* | 6/2002 | Sathe | H01L 23/4006 361/700 |
| 2003/0019103 | A1 | 1/2003 | Sagal et al. | |
| 2003/0072131 | A1* | 4/2003 | Hood | G06F 1/1616 361/679.09 |
| 2007/0029070 | A1 | 2/2007 | Yamamoto et al. | |
| 2007/0068657 | A1* | 3/2007 | Yamamoto | H05K 7/20336 165/104.26 |
| 2007/0133174 | A1* | 6/2007 | Mikami | H01L 23/427 361/700 |
| 2010/0307720 | A1* | 12/2010 | Liu | H01L 23/427 165/104.26 |
| 2012/0106088 | A1* | 5/2012 | Huang | H01L 23/427 361/720 |
| 2013/0145612 | A1* | 6/2013 | Busch | G06F 1/182 29/601 |
| 2013/0279115 | A1* | 10/2013 | Blumenthal | G02B 6/4271 361/700 |
| 2015/0116928 | A1* | 4/2015 | Delano | H01L 23/433 361/679.47 |
| 2015/0233646 | A1* | 8/2015 | Lin | F28D 15/0233 165/104.26 |
| 2017/0163302 | A1 | 6/2017 | Saeidi et al. | |
| 2018/0010861 | A1 | 1/2018 | Wakaoka et al. | |
| 2018/0204783 | A1* | 7/2018 | Han | G06F 1/1626 |
| 2019/0200446 | A1* | 6/2019 | Long | H05K 7/20336 |
| 2019/0377392 | A1* | 12/2019 | Mani | G06F 1/203 |

* cited by examiner

KEY

▨ = Corrosion of Structural Base Material

▨ = Structural Base Material

▨ = Wicking Structure

▨ = Conductive Material

VAPOR CHAMBER HAVING AN ELECTROMAGNETIC SHIELDING LAYER AND METHODS OF MANUFACTURING THE SAME

BACKGROUND

Component packaging is a key consideration in the design of compact electronic devices such as laptop computers, smart phones, wearable technologies, or any other device in which spatial constraints restrict where different components can be suitably located. For example, in electronic devices that house heat emitting components (e.g., processors and/or batteries), thermal management components such as vapor chambers may be incorporated to efficiently dissipate the emitted heat. Furthermore, in electronic devices that house multiple antennas for concurrently receiving different electromagnetic (EM) signals (e.g., BLUETOOTH® and/or WI-FI®), EM shielding components may be incorporated to isolate the multiple antennas from one another. Modern electronic devices typically include both heat emitting components as well as multiple antennas and, therefore, incorporate both thermal management components and EM shielding components.

Efficiently packaging discrete components that are dedicated to both thermal management and EM shielding into a device often leads to performance tradeoffs. For example, a designer may opt to route a thermal management component in a relatively inefficient manner (e.g., that negatively affects thermal performance) in order locate an EM shielding component so as to efficiently isolate two antennas. In addition to component packaging tradeoffs leading to in-optimal performance, the inclusion of multiple different components that are dedicated to address individual challenges leads to an undesirable increase in the overall weight and cost of compact electronic devices.

It is with respect to these and other considerations that the disclosure made herein is presented.

SUMMARY

Technologies described herein provide a vapor chamber that includes an electromagnetic (EM) shielding layer. Generally described, the techniques disclosed herein enable surface treatment(s) to be applied to a region(s) of a vapor chamber to modulate EM shielding characteristics of the vapor chamber at that region(s). The vapor chamber may be constructed from a structural base material having a suitable size, strength, and/or weight for a specific application (e.g., wearable electronic devices). The vapor chamber may also comprise treated region(s) to provide suitable EM shielding characteristics for the specific application. As an example, an oxidation layer may be abrasively removed (e.g., via sand blasting) from the region(s) to expose the structural base material while the vapor chamber is in an inert environment that prevents another oxidation layer from forming. Then, while the vapor chamber remains within the same inert environment, a material having suitable electrical conductive properties may be deposited onto the exposed structural base material to form an EM shielding layer at the region(s). When the vapor chamber is installed into an electronic device, the EM shielding layer may be electrically grounded so as to isolate one or more components within the electronic device from EM signal interference. In this way, a vapor chamber may be tailored to the specific application to serve as both a thermal management component and also an EM shielding component.

In some configurations, a vapor chamber that includes an EM shielding layer may be incorporated into an electro-thermal system that includes both a heat source and one or more electronic components that are susceptible to interference from EM signals. An exemplary such components may be an antenna, transceiver chip, a receiver chip, or any other electronic component for which a performance of a functionality may at least partially suffer from interference caused by errant EM signals. The electro-thermal system may be, for example, a computing device that includes a processing unit that generates heat during operation at a sufficiently high rate such that dissipating the heat via a vapor chamber is desirable. The electro-thermal system may further include a first antenna for generating and/or receiving first EM signals and a second antenna for generating and/or receiving second EM signals. As a specific but non-limiting example, the first antenna may be within a transceiver chip that is configured to send and receive EM signals in accordance with BLUETOOTH® technology whereas the second antenna may be within another transceiver chip that is configured to send and receive EM signals in accordance with WI-FI® technology. Exemplary electro-thermal systems include, but are not limited to, "smart" cellular phones, laptop computers, Augmented-Reality (AR) devices, or any other device having components that generate heat during operation and/or that are susceptible to EM signal interference.

The vapor chamber may be positioned in thermal contact with the heat source to absorb heat into a working fluid and to convectively transfer the heat away from the heat source. For example, the vapor chamber may include one or more walls having inner surfaces that define a convention cavity through which the working fluid can flow. The working fluid may be a bi-phase fluid that evaporates from a liquid state into a gaseous state upon absorbing latent heat that is emitted from the heat source. The working fluid may then flow, in the gaseous state, through the convection cavity away from the heat source before releasing the latent heat, re-condensing into the liquid state, and being wicked back toward the heat source. Exemplary working fluids include, but are not limited to, water, refrigerant substances (e.g., R134), ammonia-based liquids, or any other substance suitable for efficiently transferring heat convectively.

The walls that define the convection cavity may be constructed from a structural base material having a desirable combination of thermal and structural properties. Exemplary such structural base materials include, but are not limited to, titanium and titanium-based alloys. The structural properties of titanium enable the one or more walls of the vapor chamber to be significantly thinner than would be permissible in copper vapor chamber applications. Thus, although the thermal conductivity coefficient of titanium is less than that of copper (a traditional material for vapor chamber construction), the relative wall thickness that is achievable between these two materials results in titanium vapor chambers exhibiting thermal conductivities that are significantly higher than typical solid copper vapor chambers.

An outer surface of the walls may be configured at one or more region(s) to deposit an EM shielding layer onto the structural base material of the vapor chamber. For example, a conductive material (that is different than the structural base material) which has desirable electrical properties for serving as an EM shield may be deposited onto the outer surface of the walls. Exemplary such conductive materials include, but are not limited to, gold, carbon, nickel, copper, etc. The deposited conductive material may then be grounded within the electro-thermal system to cause the vapor chamber to exhibit EM shielding characteristics between various components of the electro-thermal system. In some embodiments, the conductive material may be deposited to form an EM shielding layer over the structural base material. This EM shielding layer may itself provide for the desired EM shielding characteristics. Additionally, or alternatively, the deposited conductive material may provide for a suitable grounding path between the structural base material and the electro-thermal system so that the structural base material itself is grounded so as to provide the desired EM shielding characteristics.

In some embodiments, the structural base material may readily react with an ambient environment such as air to form a corrosion layer that exhibits electrical properties that are ill suited to produce EM shielding characteristics. For example, in implementations where the structural base material is a titanium alloy, the structural base material may react with oxygen from air to form a passive oxide layer that prevents further oxidation. The oxide layer(s) formed over titanium alloys are, however, electrically insulating with extremely high resistivities. As such, these oxide layers do not themselves exhibit EM shielding characteristics and also prevent the relatively more electrically conductive structural base material from being efficiently grounded so as to act as an EM shield. Such oxide layers may form very quickly upon the structural base material contacting air. As an example, a 10 to 20 nanometer thick layer of native oxide forms almost immediately after sandblasting a titanium-alloy.

To prevent formation of an oxide layer on the structural base material prior to depositing the conductive material onto the structural base material, the conductive material may be deposited onto the region(s) of the vapor chamber via a predetermined surface treatment that includes multiple steps sequentially performed within an inert environment. This inert environment may prevent (or at least slows) an oxidation layer from forming over the structural base material. For example, the vapor chamber may be placed in a vacuum or inert gas (e.g., argon, nitrogen, etc.) that prevents oxidation and/or other forms of corrosion. Then, while the vapor chamber is in the inert environment, a layer of corrosion (e.g., Titanium Dioxide, etc.) may be removed from the regions to expose the structural base material in pure form. With the vapor chamber remaining within inert environment, the conductive material may be deposited onto the exposed structural base material. For example, the conductive material may be deposited using various thin-film deposition techniques such as, for example, sputtering, chemical solution deposition, electroplating, and so on.

The deposited conductive material may form an EM shielding layer that is electrically grounded when the vapor chamber is properly installed into the electro-thermal system. As a specific but non-limiting example, the EM shielding layer may be a thin (e.g., less than 0.02 millimeter) film of gold that is suitably thick to at least partially absorb a target form of EM radiation (e.g., BLUETOOTH® signals, WI-FI® signals, etc.) when properly grounded. In this way, the vapor chamber design and methods of manufacturing the same that are described herein enable a vapor chamber to efficiently serve as both a thermal management component and also an EM shielding component within an apparatus such as the described thermo-electric system.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

Figure 3:
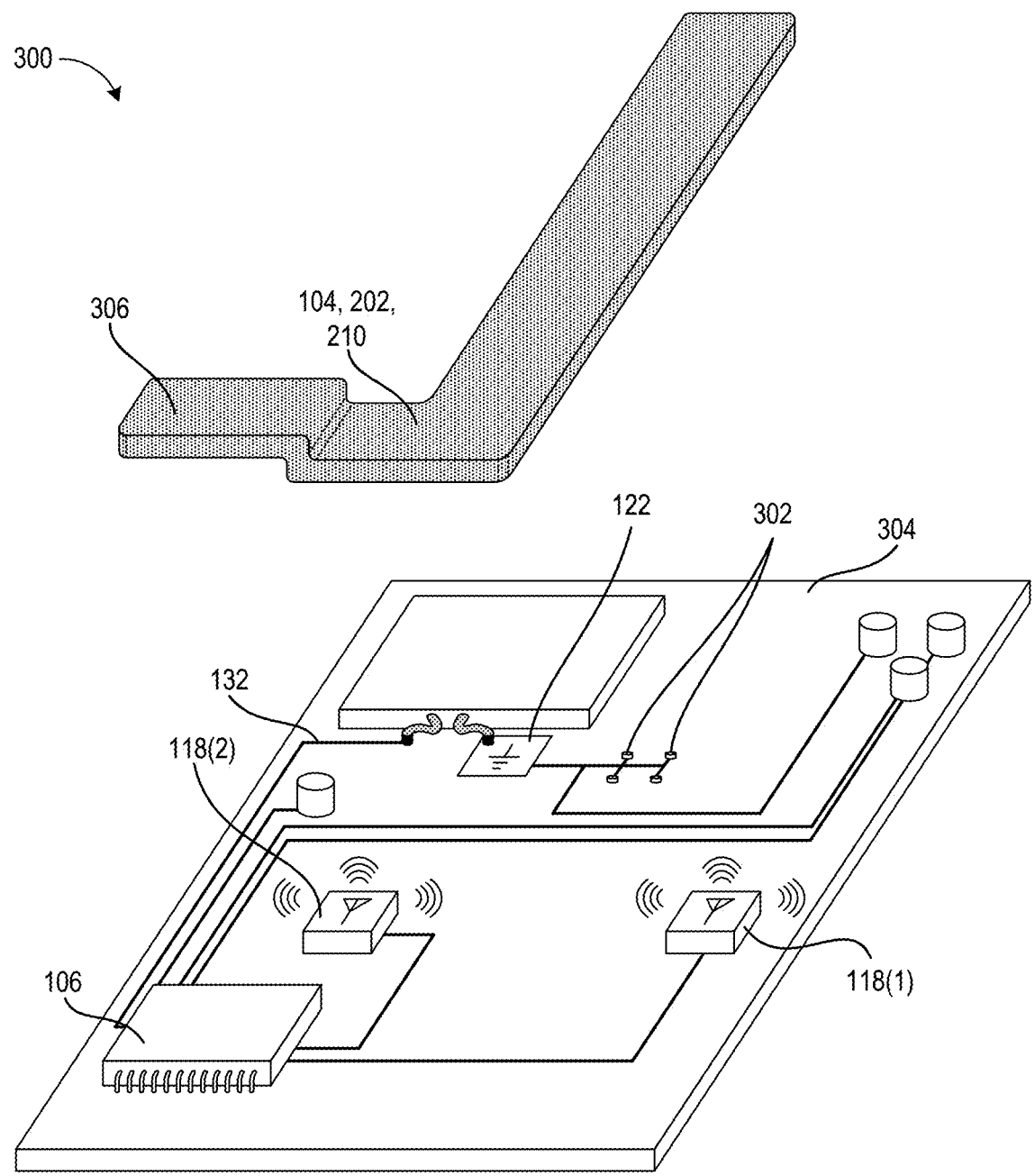

FIG. 3 illustrated an exemplary embodiment of an "electro-thermal" system that includes one or more grounding contacts that are positioned on a circuit board so as to contact the conductive material that is deposited on an outer surface of a vapor chamber.

Figure 4:
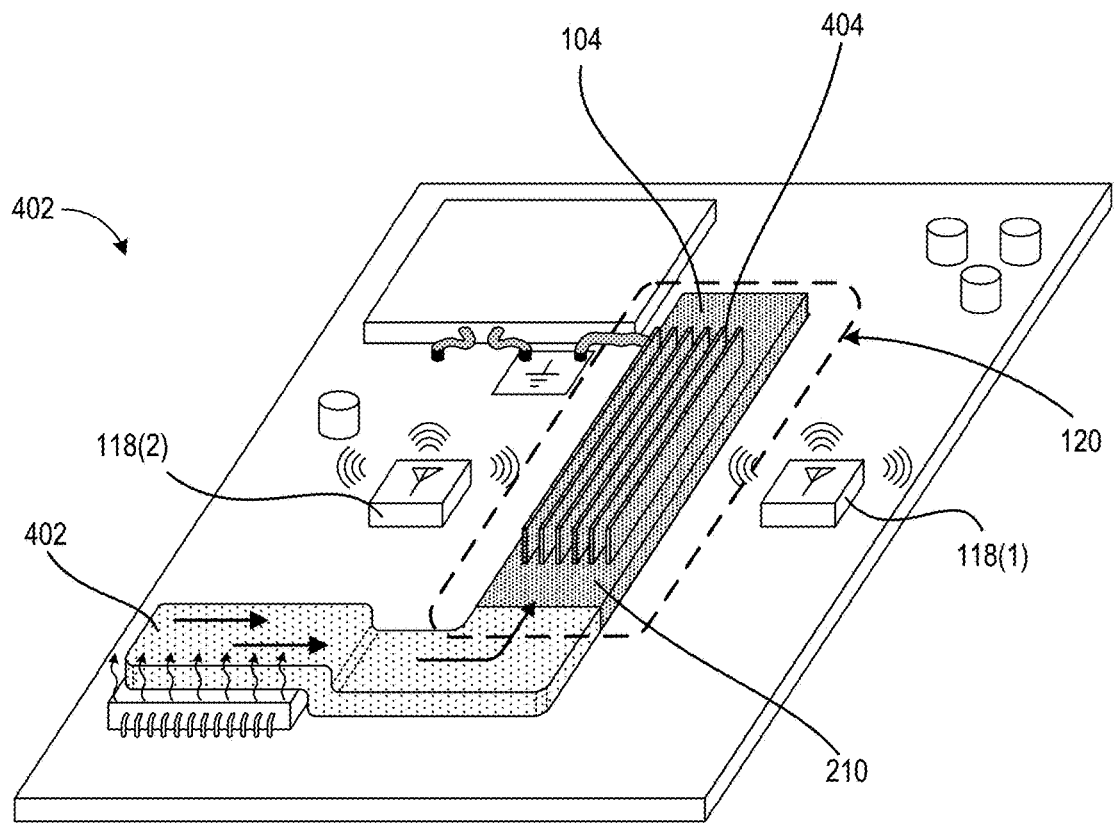

FIG. 4 illustrates an exemplary embodiment of an "electro-thermal" system in which a vapor chamber includes one or more fins that are both thermally and electrically conductive and which are grounded to an electric circuit.

Figure 5:
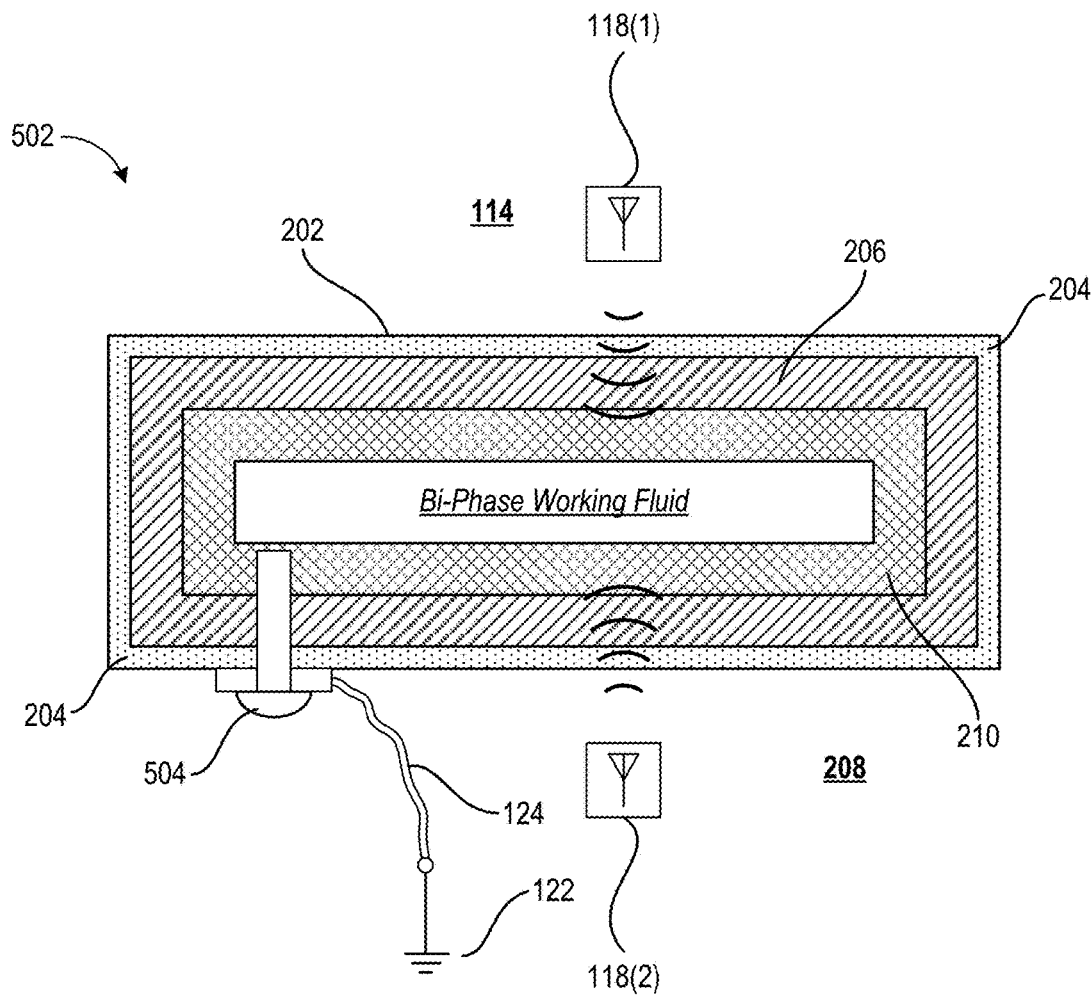

FIG. 5 illustrates an embodiment of a vapor chamber in which a wicking structure is electrically connected to an electrical ground so that the wicking structure exhibits EM shielding characteristics.

Figure 6:
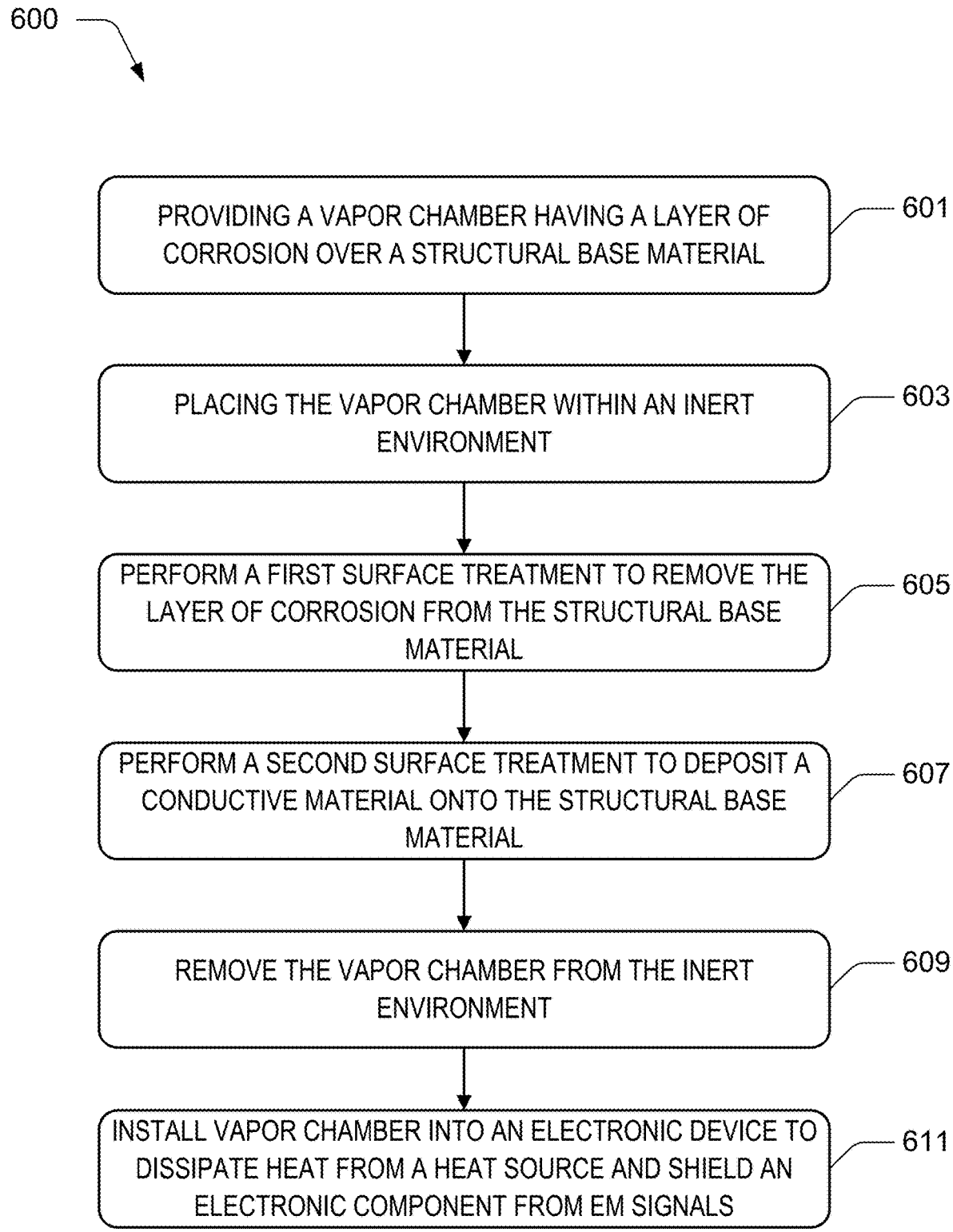

FIG. 6 is a flow diagram of a process for manufacturing a thermal management system.

DETAILED DESCRIPTION

The following Detailed Description describes technologies that provide a vapor chamber that includes an electromagnetic (EM) shielding layer. Generally described, the techniques disclosed herein enable surface treatment(s) to be applied to a vapor chamber to modulate EM shielding characteristics at various regions of the vapor chamber. The vapor chamber may be constructed from a structural base material that provides for a suitable size, strength, and/or weight of the vapor chamber for a specific application. A predetermined surface treatment may be applied to the structural base material at various region(s) to provide suitable EM shielding characteristics for the specific application. The predetermined surface treatment may include placing the vapor chamber into an inert environment and then performing a sequence of surface treatments to an outer surface of the vapor chamber—all while the vapor chamber remains within the inert environment. An exemplary sequence of treatments may include initially removing an oxide layer from the vapor chamber to expose the structural base material (e.g., without corrosion thereon) and then depositing a conductive material directly over the exposed region of the structural base material.

The deposited conductive material may form the EM shielding layer and may serve as an electrical grounding interface for the vapor chamber and also to prevent further corrosion of the portion of the structural base material onto which the conductive material has been deposited. By connecting the EM shielding layer to a ground of an electronic device, the vapor chamber may be suitable for isolating one or more components within the electronic device from EM signal interference. In this way, a design for the vapor chamber may be tailored to the specific application to serve as both a thermal management component and also an EM shielding component. Benefits of the vapor chamber serving dual purposes include, but are not limited to, facilitating reduced size, weight, and cost of electronic devices.

Figure 1:
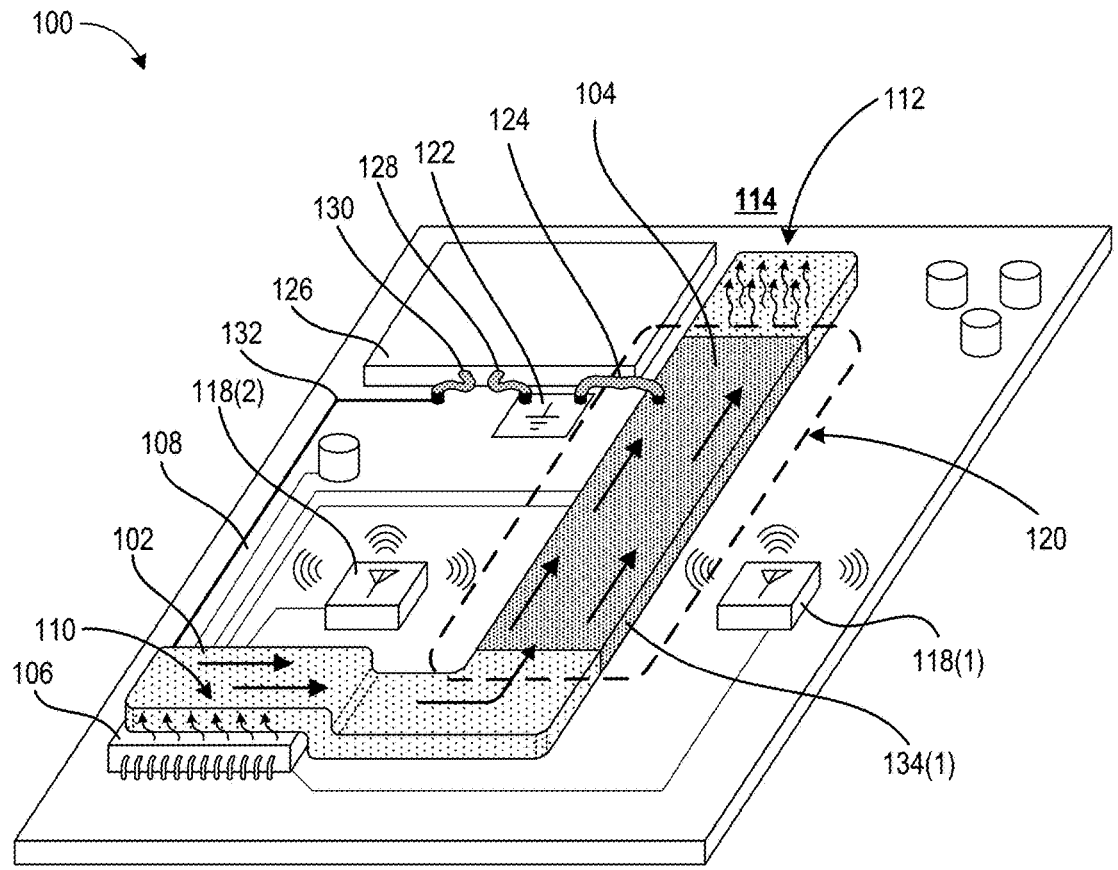
FIG. 1 is a perspective view of an exemplary electro-thermal system that includes a vapor chamber having an EM shielding layer deposited thereon.

FIG. 1 is a perspective view of an exemplary electro-thermal system 100 (also referred to herein as "system") that includes a vapor chamber 102 having a conductive material deposited thereon to form an EM shielding layer 104. The system 100 includes a heat source 106 that is in thermal contact with the vapor chamber 102. In the illustrated embodiment, the system 100 is a computing device that includes various components mounted to a support element 108 such as would be found in a typical "smart" cellular phone, laptop computer, and/or Augmented-Reality (AR) headset. It can be appreciated that in various embodiments the support element 108 may be a circuit board that has an electronic circuit 132 integrated therein to interconnect the various electronic components (e.g., central processing units, graphics processing units, memory, battery, transceiver chips, etc.) that are mounted to the support element 108. As illustrated, the vapor chamber 102 absorbs heat at a heat absorption zone 110 and then convectively transfers the heat to a heat dissipation zone 112 where the heat is dissipated into an ambient environment 114. Solid black arrows are illustrated on the vapor chamber 102 to generally indicate the direction that heat is convectively transferred within the convective cavity (not visible in FIG. 1) of the vapor chamber 102.

The system 100 may further include one or more components that are susceptible to interference from EM radiation. In the illustrated embodiment, the system 100 includes a first antenna 118(1) and a second antenna 118(2) that is susceptible to interference from EM radiation that is generated by the first antenna 118(1). For illustrative purposes, EM radiation/signals are graphically represented as four curved lines. In one example, the first antenna 118(1) may be within a transceiver chip that is mounted to the support structure 108 and is configured to send and receive first EM signals (e.g., BLUETOOTH® signals). Building on this example, the second antenna 118(2) may be within another transceiver chip that is also mounted to the support structure 108 and is configured to send and receive second EM signals (e.g., WI-FI® signals). It can be appreciated that since both the first antenna 118(1) and the second antenna 118(2) may be packaged within the system 100 in close proximity to one another, concurrent operation of both antennas 118 may result in signal interference at one or both of the antennas 118. This may be especially true under circumstances where the antennas 118 utilize different technologies that share a frequency (e.g., BLUETOOTH® and WI-FI® technologies share the same 2.4 GHz frequency).

A region 120 of the vapor chamber 102 may be positioned between the first antenna 118(1) and the second antenna 118(2). The vapor chamber 102 may carry heat through this region 120 and/or dissipate heat from this region 120. For example, the vapor chamber 102 may be positioned in thermal contact with the heat source 106 so that heat emitted by the heat source 106 is continually absorbed into a working fluid contained within a convection cavity of the vapor chamber 102. The working fluid may be a bi-phase fluid that evaporates from a liquid state into a gaseous state upon absorbing latent heat that is emitted from the heat source. The working fluid may then flow, in the gaseous state, through the convection cavity away from the heat source before releasing the latent heat, re-condensing into the liquid state, and being wicked back toward the heat source.

The convection cavity may be defined by walls that are made from a structural base material. In some embodiments, the structural base material may have a combination of thermal and structural properties that enable the vapor chamber 102 to be relatively lighter, smaller, and stronger than typical solid copper vapor chambers. In some embodiments, the structural base material is titanium or an alloyed titanium that has structural properties which enable the walls of the vapor chamber to be significantly thinner than would be permissible in a typical solid copper vapor chamber. Although the thermal conductivity coefficient of titanium (and alloys thereof) is typically less than that of copper, the relatively thinner wall thickness that is achievable by using titanium as opposed to copper results in titanium vapor chambers exhibiting thermal conductivities significantly higher than typical solid copper vapor chambers.

As illustrated, the region 120 of the vapor chamber 102 that is positioned between the first antenna 118(1) and the second antenna 118(2) may have a conductive material deposited thereon to form an EM shielding layer 104. Exemplary conductive materials include, but are not limited to, aluminum, copper, gold, carbon, nickel, zinc, and any other material suitable for absorbing EM radiation when properly grounded to an electric circuit. The EM shielding layer 104 may be in electrical contact with a ground 122 of an electric circuit 132 of the system 100. For example, as illustrated, the system 100 further includes a wire 124 having two ends with one end mechanically coupled to the EM shielding layer 104 and another end mechanically coupled to the ground 122. In the illustrated embodiment, the system 100 further includes a battery 126 that is mounted to the support element 106. A negative lead 128 of the battery 126 is connected to the ground 122. A positive lead 130 of the battery is connected to an electric circuit 132 to provide power to the various components of the system 100.

By virtue of the EM shielding layer 104 being made from a "grounded" conductive material that is located between the first antenna 118(1) and the second antenna 118(2), the EM shielding layer 104 may absorb (e.g., reduce the strength of) at least some of the EM signals emitted by one or both of the antennas 118. Thus, the strength of the EM signals emitted by the first antenna 118(1) will be weaker at the second antenna 118(2) than those EM signals would otherwise would be without the EM shielding layer 104 being present on the vapor chamber 102. In this way, in addition to serving as a thermal management component to dissipate heat away from the heat source 106, the vapor chamber 102 also serves as an EM shielding component to shield the second antenna 118(2) from EM signals that are emitted by the first antenna 118(1), and vice versa. Stated plainly, the EM shielding layer 104 being positioned between the antennas 118 reduces an amount that EM signals that are emitted by one antenna 118 interfere with the other antenna being able to efficiently receive other EM signals. In some cases, these other EM signals that the other antenna is to receive are emitted from a source that is external to the system 100 (e.g., a wireless router, a cellular tower, etc.).

In the illustrated example, the vapor chamber 102 is mounted onto the support element 106 with a first side facing the first antenna 118(1) and a second side (not visible in FIG. 1) that is opposite the first side facing the second antenna 118(2). Thus, a direct path between the first antenna 118(1) and the second antenna 118(2) passes through the vapor chamber 102. Although the vapor chamber 102 is illustrated as having a flat form, as used herein the term vapor chamber 102 is used broadly to refer to any thermal management component having a fluid encapsulated therein for convectively transferring heat. Accordingly, for purposes of the present disclosure, the term "vapor chamber" encompasses various form factors that are colloquially referred to in the industry as heat pipes and as vapor chambers.

As indicated by the KEY, in FIG. 1 both of a layer of corrosion and a layer of the conductive material are present on an outer surface of the vapor chamber 102. It should be appreciated that underneath each of these layers is the structural base material as described herein. Although in the illustrated embodiment the conductive material is deposited over only a portion of the vapor chamber 102, as shown in FIG. 3, in various embodiments the conductive material may be deposited over the entire outer surface of the vapor chamber 102.

Figure 2A:
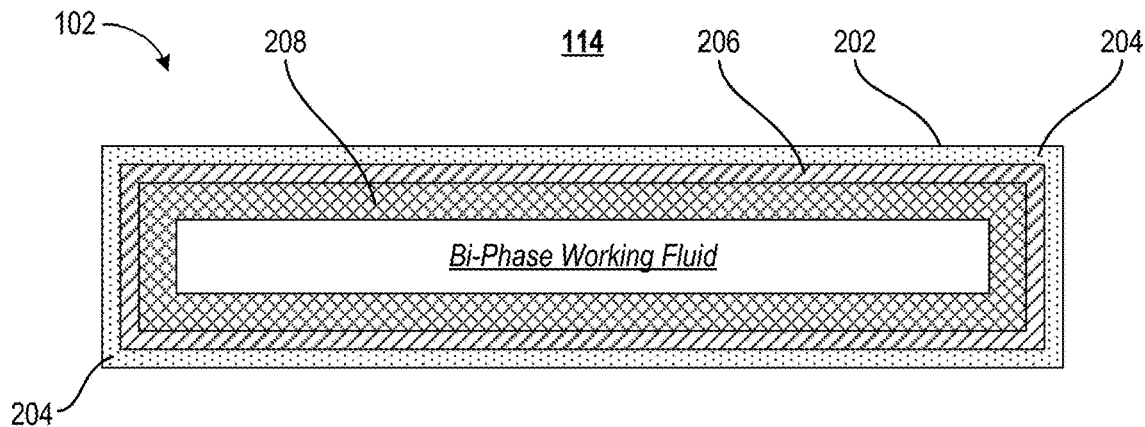
FIG. 2A illustrates a cross-section view of a region of the vapor chamber of FIG. 1 that has not been treated to have a conductive material deposited on an outer surface of the vapor chamber.
Figure 2B:
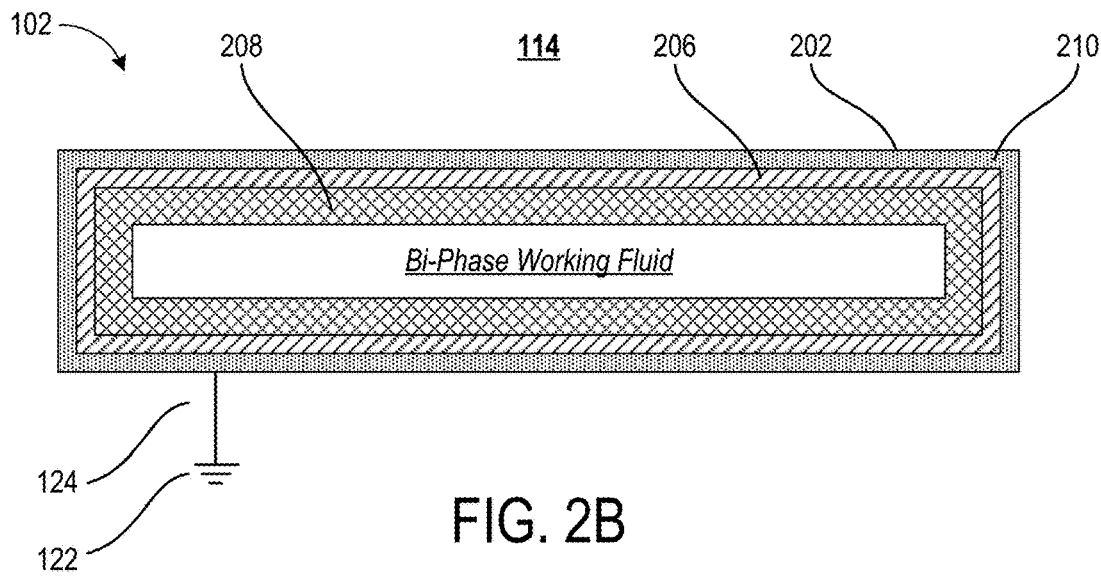
FIG. 2B illustrates a cross-section view of another region of the vapor chamber of FIG. 1 that has been treated to have a conductive material deposited on the outer surface of the vapor chamber.

Turning now to FIGS. 2A and 2B (collectively referred to herein as FIG. 2), various cross-section views are shown of different regions of the vapor chamber 102 of FIG. 1. With specific reference to FIG. 2A, illustrated is a cross-section view of a region of the vapor chamber 102 at which an outer surface 202 has not been treated in accordance with the predetermined surface treatment. As indicated by the KEY of FIG. 2, at this region of the vapor chamber 102 the outer surface 202 is made up of the layer of corrosion 204 (shown but not labeled in FIG. 1) that results from the structural base material 206 reacting with an ambient environment 114 such as air. As a specific but non-limiting example, the structural base material 206 may be titanium or a titanium alloy that reacts with oxygen molecules that are present in the ambient environment 114 to form the layer of corrosion 204.

In some respects, such a reaction may be desirable since the layer of corrosion 204 seals off the structural base material 206 from the ambient environment 114 thereby preventing further corrosion. In other respects, however, such a reaction may be undesirable since the layer of corrosion 204 lacks electrical properties that are suitable to exploit for EM shielding purposes. For example, since blocking EM fields is achieved by making barriers of conductive materials that absorb EM energy, electrically insulating materials with high resistivities are ill-suited for use as EM shields. For this reason, the oxide layer(s) that are formed over titanium and titanium alloys and which have extremely high resistivities (e.g., as compared to copper, gold, nickel, titanium, and other solid metals) do not exhibit EM shielding characteristics. Exacerbating the problem of the layer of corrosion 204 not acting as an EM shield, this layer also prevents the relatively more electrically conductive structural base material 206 from being efficiently grounded so as to act as an EM shield. In many cases, materials that have a combination of structural and thermal properties that are suitable for use as the structural base material 206 will, unfortunately, form the layer of corrosion 204 very quickly upon contacting the ambient environment 114. For example, titanium alloys may form a new layer of native oxide corrosion that is 10 to 20 nanometers thick almost immediately after a surface treatment is performed thereon to abrasively remove a previous layer of native oxide corrosion.

In the illustrated example, the vapor chamber 102 further includes a wicking structure 208 to exert a capillary action on the condensed liquid and ultimately to assist in drawing the condensed liquid back to the heat absorbing portion of the vapor chamber 102. Exemplary wicking structures include, but are not limited to, sintered metal powders, screens, and/or grooved wicks that are sufficiently small to cause the working fluid to experience capillary forces within the grooved wicks at a boundary between the gaseous state and the liquid state.

Turning now to FIG. 2B, illustrated is a cross-section view of the region 120 of the vapor chamber 102 shown in FIG. 1 at which a conductive material 210 (shown but not labeled in FIG. 1) has been deposited to form the EM shielding layer 104. In contrast to FIG. 2A, at the region 120 of the vapor chamber 102 shown in FIG. 2B the layer of corrosion 204 is substantially absent. Thus, the layer of the conductive material 210 (that makes of the EM shielding layer described herein) is in substantially direct contact with the structural base material 206. In this way, the high resistivity of the layer of corrosion 204 does not impact the ability of electrical currents to flow between the conductive material 210 and the structural base material 206.

As further shown in FIG. 2B, the conductive material 210 may be electrically connected to the ground 122 of the electric circuit 132. For example, a wire 124 may be soldered directly onto the conductive material 210 and then connected to the ground 122. In this way, for the region 120 of the vapor chamber 102 over which the conductive material 210 has been deposited, the conductive material 210 forms an EM shielding layer 104 as described in FIG. 1. Furthermore, since the conductive material 210 is in direct contact with the structural base material 206 (e.g., without a significant amount of corrosion therebetween), the structural base material 206 may also exhibit EM shielding characteristics in accordance with its corresponding electrical properties (e.g., resistivity). It can be appreciated that this holds true even for those regions of the vapor chamber 102 which have a layer of corrosion 204 at the outer surface 202 so long as the structural base material 206 is electrically grounded via the conductive material 210. For example, with reference to FIG. 1, it can be appreciated that so long as the structural base material 206 is suitably conductive, EM energy emitted by the heat source 106 may be partially absorbed by the heat absorption zone 110 of the vapor chamber 102 since EM radiation may pass through the layer of corrosion 204 before ultimately being absorbed via the "grounded" structural base material 206.

As used herein, the term "conductive material" may refer to any material that exhibits less electrical resistance than the layer of corrosion 204 that forms over the structural base material 206. In some embodiments, the conductive material 210 is substantially more (e.g., 5 times more, 10 times more, 20 times more, etc.) conductive than the structural base material 206. As a specific but non-limiting example, the structural base material 206 may be a titanium alloy having a resistivity of $4 \times 10^{-7}$ Ohm-Meters (em) whereas the conductive material 210 may be copper that has a resistivity of $1.68 \times 10^{-8}$ $\Omega$m—so that the conductive material 210 is roughly 23 times as conductive as the structural base material 206.

Although illustrated without any layer of corrosion 204 whatsoever in FIG. 2B, it can be appreciated that the illustrated embodiment is shown as a nominal embodiment and that in practice there may be some amount of corrosion between the conductive material 210 and the structural base material 206—albeit substantially less than would form if the structural base material 206 were left in contact with the ambient environment 114.

In various embodiments, the vapor chamber 102 may be treated in accordance with a predetermined surface treatment to convert a region of the vapor chamber 102 as shown in FIG. 2A into a region as shown in FIG. 2B. An exemplary such predetermined surface treatment may include multiple surface treatment steps that are sequentially performed within an inert environment that prevents (or at least slows) the formation of corrosion on the structural base material 206. For example, the vapor chamber 102 may be placed into a sealed cabinet that is then evacuated to produce a vacuum around the vapor chamber 102 or filled with an inert gas vacuum chamber or chamber filled with an inert gas (e.g., argon, nitrogen, etc.) that prevents oxidation (or other forms of corrosion). While the vapor chamber 102 is within the inert environment, the layer of corrosion 204 shown in FIG. 2A may be removed. Then, while the structural base material 206 is exposed in a substantially pure form (i.e., without corrosion thereon), the conductive material 210 is deposited directly onto the structural base material 206—all while the vapor chamber 102 remains within the inert environment. Exemplary techniques for removing the layer of corrosion 204 include, but are not limited to, abrasive removal techniques (e.g., sand blasting, wire brushing, polishing, etc.) and chemical removal techniques (e.g., acid baths, etc.). Exemplary techniques for depositing the conductive material 210 directly onto the structural base material 206 include, but are not limited to, sputtering, chemical solution deposition, electroplating, and so on.

Turning now to FIG. 3, illustrated is an exemplary embodiment of a "electro-thermal" system 300 that includes grounding contacts 302 positioned on a circuit board 304 to contact the conductive material 210 that is deposited on a vapor chamber 306 when the vapor chamber 306 is properly installed into the system 300. In the illustrated embodiment, the EM shielding layer 104 covers the entire outer surface 202 of the vapor chamber 306.

As illustrated, the vapor chamber 302 is not yet installed into the system 300 so that the grounding contacts 302 are visible. It can be appreciated that when the vapor chamber 302 is properly installed as shown in FIG. 1, the grounding contacts 302 will be in electrical contact with the bottom of the vapor chamber 306—which also has the conductive material 210 deposited thereon. In this way, installation of the vapor chamber 306 into the system 300 may be simplified (e.g., as compared to embodiments similar to that shown in FIG. 1) because other than simply installing the vapor chamber 302 no additional installation steps are needed to enable the EM shielding layer 104 of the vapor chamber 306 to serve as an EM shield for one or more components of the system 100. For example, in the embodiment illustrated in FIG. 1, upon installing the vapor chamber 102 into the system 100, soldering of the wire 124 to the ground 122 and/or the conductive material 210 on the vapor chamber 102 may still be needed to provide a ground path for the EM shielding layer 104.

Turning now to FIG. 4, illustrated is an exemplary embodiment of an "electro-thermal" system 400 in which a vapor chamber 402 includes one or more fins 404 that are both thermally and electrically conductive and which are grounded to the electric circuit 132. As illustrated, the fins 404 protrude from the region 120 of the vapor chamber 402 that is positioned between the first antenna 118(1) and the second antenna 118(2). The fins 404 may be constructed from the same conductive material 210 that is deposited onto the vapor chamber 402 to form the EM shielding layer 104. Additionally, or alternatively, the fins 404 may be constructed from a thermally and electrically conductive material that is different than the conductive material 210. As a specific but non-limiting example, the conductive material 210 that is deposited onto the structural base material 206 via the predetermined surface treatment may be silver or an alloy thereof whereas the fins 404 may be a copper sheet that is soldered onto the conductive material 210 after the predetermined surface treatment.

By virtue of the fins 404 being made from a "grounded" conductive material that is located between the first antenna 118(1) and the second antenna 118(2), the fins 404 may absorb at least some of the EM signals emitted by one or both of the antennas 118. Thus, the strength of the EM signals emitted by the first antenna 118(1) will be weaker at the second antenna 118(2) than those EM signals would otherwise would be without the EM shielding layer 104 being present on the vapor chamber 102. In this way, the fins 404 may be strategically placed on the vapor chamber 404 to facilitate both heat transfer and EM shielding.

Turning now to FIG. 5, illustrated is an embodiment of a vapor chamber 502 in which the wicking structure 208 is electrically connected to the ground 122 so that the wicking structure 208 exhibits EM shielding characteristics. In the illustrated embodiment, a conductive element 504 extends through the layer of corrosion 204 and the structural base material 206 into the wicking structure 208. The conductive element 504 may be, for example, a self-tapping screw that is drilled through the layer of corrosion 204 and the structural base material 206 into the wicking structure 208. The wire 124 may be connected to the conductive element 504 as shown to provide a grounding path for the wicking structure 208.

As illustrated, at least a portion of the "grounded" wicking structure 208 may be positioned between the first antenna 118(1) and the second antenna 118(2) to shield each antenna 118 from EM signals emitted by the other antenna 118. In this way, the wicking structure 208 may serve both as a thermal management component by exerting a capillary action on a condensed fraction of the working fluid contained within the vapor chamber 502 and also as an EM shielding component that blocks and/or dampens EM signals in relation to one or more electronic components. Exemplary wicking structures include, but are not limited to, sintered metal powders, screens, and/or grooved wicks that are sufficiently small to cause the working fluid to experience capillary forces within the grooved wicks at a boundary between the gaseous state and the liquid state.

In some embodiments, the wick structure 210 may be made from the same material as the conductive element 504 and/or the structural base material 212. As a specific but non-limiting example, the structural base material 206 may be a stamped piece of solid titanium alloy, the wicking structure 208 may be a sintered powder of the titanium alloy, and the conductive element 504 may also be made from the titanium alloy. Thus, it can be appreciated that in some embodiments, the layer of corrosion 204 may cover a portion of the conductive element 504 that is exposed to the ambient environment 114. In some embodiments, the wick structure 210 may be made from a material that is different from one or both of the conductive element 504 and/or the structural base material 212. As a specific but non-limiting example, the structural base material 206 may be a stamped piece of solid titanium alloy, the wicking structure 208 may be a sintered copper powder, and the conductive element 504 may also be made from copper.

Turning now to FIG. 6, a flow diagram is illustrated of a process 600 for manufacturing a thermal management system. The process 600 is described with reference to FIGS. 1-5. The process 600 is illustrated as a collection of blocks in a logical flow. The order in which operations are described is not intended to be construed as a limitation, and any number of the described blocks can be combined in any order and/or in parallel to implement the process. Other processes described throughout this disclosure shall be interpreted accordingly.

Operation 601 includes providing a vapor chamber having a layer of corrosion that is formed over a structural base material. As a specific but non-limiting example, the vapor chamber may be constructed from a titanium alloy in a manner so that inner surfaces thereof form a sealed convection cavity. Sealed inside the convection cavity is a working fluid and, optionally, a wicking structure that for drawing a liquid fraction of the working fluid toward a heat source. The layer of corrosion forms over the outer surface of the vapor chamber due to one or more chemical reactions (e.g., oxidation).

Operation 603 includes placing the vapor chamber within an inert environment. As used herein, the term "inert environment" refers to any environment that is less chemically active with respect to a structural base material than an ambient environment of air. For example, for titanium or other structural base materials that are susceptible to oxidation, an inert environment may be an environment that includes relatively less oxygen than air. Exemplary inert environments include, but are not limited to, a pure argon environment, a pure helium environment, an environment of one or more other noble gases, an environment from which a substantial amount of gases have been evacuated (e.g., a vacuum), etc.

Operation 605 includes performing a first surface treatment to one or more regions of the vapor chamber to remove at least some of the layer of corrosion. In various implementations, the first surface treatment is performed to the one or more regions while the vapor chamber is within the inert environment so as to prevent a new layer of corrosion to form upon the structural base material being exposed. For example, the first surface treatment may be performed within a sealed enclosure that is configured to generate the inert environment upon being closed (e.g., after the vapor chamber is placed therein) and includes sandblasting tools to sand blast the layer of oxidation off of the vapor chamber.

Operation 607 includes performing a second surface treatment to the one or more regions of the vapor chamber to deposit a layer of a conductive material over the exposed portion of the structural base material from which the layer of oxidation has been removed. For example, a conductive material such as copper and/or gold may be deposited onto the vapor chamber via sputtering (e.g., a process of depositing metals onto a target surface) and/or electroless plating and/or electrolytic plating, or any other process suitable for depositing a conductive material onto a target surface. In various implementations, the vapor chamber is never removed from the inert environment until after the second surface treatment is performed. In this way, a good conductive interface may be formed between the structural base material and the conductive material.

Operation 609 includes removing the vapor chamber from the inert environment, e.g., the vapor chamber may be returned to an environment of air.

Operation 611 includes installing the vapor chamber into an electronic device to dissipate heat from a heat source (e.g., a processor unit) and also to shield an electronic component (e.g., an antenna) from EM signals. For example, the vapor chamber may be installed into the system 100 as shown in FIG. 1.

It should be appreciated any reference to "first," "second," etc. items and/or abstract concepts within the description is not intended to and should not be construed to necessarily correspond to any reference of "first," "second," etc. elements of the claims. In particular, within this Detailed Description and/or the previous Summary, items and/or abstract concepts such as, for example, antennas and/or EM signals may be distinguished by numerical designations without such designations corresponding to the claims or even other paragraphs of the Summary and/or Detailed Description. For example, any designation of a "first antenna" and "second antenna" within a paragraph of this disclosure is used solely to distinguish two different antennas within that specific paragraph—not any other paragraph and particularly not the claims.

FIGS. 1-6 illustrate/describe various alternate embodiments of the vapor chamber(s) and system(s) disclosed herein. Specific details being illustrated/described with another specific detail or, alternatively, apart from another specific detail is not intended to be construed as a limitation. Thus, any individual detail illustrated in and/or described with respect to any figure herein may be combined in practically any manner with any other individual detail illustrated in and/or described with respect to any other figure herein. Other individual details illustrated and/or described throughout this disclosure shall be interpreted accordingly.

The presently disclosed techniques are believed to be applicable to a variety of systems and approaches involving applying surface treatments to vapor chambers to improve EM shielding capabilities of the vapor chamber. Aspects of this disclosure are predominantly disclosed in the context of a titanium vapor chamber that is subjected to a multi-step surface treatment that is performed within an inert environment. Aspects of this disclosure are also predominantly disclosed in the context of the treated region of the titanium vapor chamber being disposed between two antennas of an electro-thermo system. While the presently disclosed techniques are not necessarily limited to such specific applications where a treated region of a titanium vapor chamber is disposed between two antennas, an appreciation of various aspects of the disclosed techniques is best gained through a discussion of examples in the aforementioned contexts. However, the vapor chamber may be constructed from a variety of structural base materials, can be subjected to a variety of surface treatments (which may take place, wholly or partially, within an inert environment and/or air), and can be positioned within an electro-thermal system to shield a variety of electronic components from EM signals—which may originate from within the electro-thermal system and/or from sources that are external to the electro-thermal system. These and other variations shall be considered variations that do not depart from the present disclosure.

Example Clauses

The disclosure presented herein may be considered in view of the following clauses.

Example Clause A, an electro-thermal system, comprising: a first antenna for generating first electromagnetic signals; a second antenna for receiving second electromagnetic signals; a vapor chamber to absorb heat from a heat source and to transfer the heat through a region that is positioned between the first antenna and the second antenna, wherein the region of the vapor chamber is configured according to a predetermined surface treatment to at least one of: deposit an electromagnetic shielding layer onto a structural base material of the vapor chamber, or access the electromagnetic shielding layer underneath the structural base material; and an electronic circuit having a ground that is in electric contact with the electromagnetic shielding layer to reduce an amount that the first electromagnetic signals interfere with the second antenna receiving the second electromagnetic signals.

Example Clause B, the electro-thermal system of Example Clause A, wherein the predetermined surface treatment includes: enclosing the vapor chamber in an inert environment; and while the vapor chamber is within the inert environment: removing an oxidation layer from the vapor chamber to expose the structural base material, and depositing the electromagnetic shielding layer onto the structural base material.

Example Clause C, the electro-thermal system of Example Clause B, wherein the structural base material is a titanium-alloy.

Example Clause D, the electro-thermal system of any one of Example Clauses A through C, wherein the structural base material of the vapor chamber has a first strength-to-weight ratio, and wherein the electromagnetic shielding layer, that is deposited onto the structural base material, has a second strength-to-weight ratio that is less than the first strength-to-weight ratio.

Example Clause E, the electro-thermal system of Example Clause D, wherein the structural base material has a first resistivity, and wherein the electromagnetic shielding layer has a second resistivity that is at least ten times less than the first resistivity.

Example Clause F, the electro-thermal system of any one of Example Clauses A through E, wherein the electronic circuit is integrated into a circuit board on which the vapor chamber is mounted with a first side facing the first antenna and a second side facing the second antenna.

Example Clause G, the electro-thermal system of Example Clause F, wherein the circuit board includes one or more grounding contacts that are positioned on the circuit board to contact the electromagnetic shielding layer when the vapor chamber is mounted to the circuit board.

Example Clause H, the electro-thermal system of any one of Example Clauses A through G, further comprising a wire having a first end that is mechanically coupled to the electromagnetic shielding layer of the vapor chamber and a second end that is mechanically coupled to the ground of the electronic circuit.

Example Clause I, an apparatus comprising: at least one support element; an electronic component mounted at a first location of the at least one support element, wherein a performance of the electronic component is at least partially susceptible to interference from EM signals; and a vapor chamber that is constructed from a titanium base material and includes a region that is positioned to shield the electronic component from the EM signals, wherein at least a portion of the titanium base material is configured according to a predetermined surface treatment to facilitate electrical grounding of the region that is positioned to shield the electronic component from the EM signals.

Example Clause J, an apparatus of Example Clause I, wherein the predetermined surface treatment includes: performing a first surface treatment to remove an oxidation layer from the titanium base material at the portion of the vapor chamber, and performing a second surface treatment to deposit a conductive material onto the titanium base material at the portion of the vapor chamber.

Example Clause K, an apparatus of Example Clause J, wherein each of the first surface treatment and the second surface treatment are performed within an inert environment.

Example Clause L, an apparatus of Example Clause K, wherein the conductive material has a first resistivity that is at least two times greater than a second resistivity of the titanium base material.

Example Clause M, an apparatus of any one of Example Clauses I though L, wherein the vapor chamber includes one or more fins that are located at the region that is positioned to shield the electronic component from the EM signals, and wherein the one or more fins are electrically grounded.

Example Clause N, an apparatus of any one of Example Clauses I though M, wherein the at least one support element is a circuit board that includes a ground that is in electric contact with the region of the vapor chamber that is positioned to shield the electronic component from the EM signals.

Example Clause O, a method comprising: placing a vapor chamber within an inert environment; performing a first surface treatment to a region of the vapor chamber to remove at least some of a layer of corrosion; performing a second surface treatment to the region of the vapor chamber to deposit a conductive material over the structural base material; removing the vapor chamber from the inert environment; and installing the vapor chamber into an electronic device to dissipate heat from a heat source and to shield an electronic component from EM signals.

Example Clause P, the method of Example Clause O, further comprising affixing one or more fins to the region of the vapor chamber on which the conductive material is deposited.

Example Clause Q, the method of any one of Example Clauses O through P, wherein: the first surface treatment includes at least one of: an abrasive removal technique, or a chemical removal technique; and the second surface treatment includes at least one of: sputtering, chemical solution deposition, electroless plating, or electrolytic plating.

Example Clause R, the method of any one of Example Clauses O through Q, wherein the structural base material is titanium or a titanium alloy.

Example Clause S, the method of any one of Example Clauses O through R, wherein installing the vapor chamber into the electronic device includes soldering a wire to the conductive material to provide electric contact between the conductive material and a ground of the electronic device.

Example Clause T, the method of any one of Example Clauses O through S, wherein the electronic component is an antenna.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. An electro-thermal system, comprising:
a first antenna for generating first electromagnetic signals;
a second antenna for generating second electromagnetic signals;
a vapor chamber, in thermal communication with a heat source, that has an electromagnetic shielding layer on an outer surface of a region that is positioned between the first antenna and the second antenna, and that attenuates (i) a portion of the first electromagnetic signals that is directed toward the second antenna, and (ii) a portion of the second electromagnetic signals that is directed toward the first antenna, wherein the vapor chamber comprises another region that is adjacent to the region and that has a corrosion layer on an outer surface; and
an electronic circuit having a ground that is in electric contact with the region that is positioned between the first antenna and the second antenna.

2. The electro-thermal system of claim 1, wherein the electromagnetic shielding layer is deposited onto a structural base material in accordance with a predetermined surface treatment that includes:
enclosing the vapor chamber in an inert environment; and
while the vapor chamber is within the inert environment:
removing an oxidation layer from the vapor chamber to expose the structural base material, and
depositing the electromagnetic shielding layer onto the structural base material.

3. The electro-thermal system of claim 2, wherein the structural base material is a titanium-alloy.

4. The electro-thermal system of claim 1, wherein a structural base material of the vapor chamber has a first strength-to-weight ratio, and wherein the electromagnetic shielding layer, is deposited onto the structural base material and has a second strength-to-weight ratio that is less than the first strength-to-weight ratio.

5. The electro-thermal system of claim 4, wherein the structural base material has a first resistivity, and wherein the electromagnetic shielding layer has a second resistivity that is at least ten times less than the first resistivity.

6. The electro-thermal system of claim 1, wherein the electronic circuit is integrated into a circuit board on which the vapor chamber is mounted with a first side facing the first antenna and a second side facing the second antenna.

7. The electro-thermal system of claim 6, wherein the ground includes one or more grounding contacts that are positioned on the circuit board to contact the region when the vapor chamber is mounted to the circuit board.

8. The electro-thermal system of claim 1, further comprising a wire having a first end that is mechanically coupled to the region of the vapor chamber and a second end that is mechanically coupled to the ground of the electronic circuit.

9. The electro-thermal system of claim 1, wherein the first electromagnetic signals generated by the first antenna are emitted at a frequency that is common to the second electromagnetic signals generated by the second antenna.

10. The electro-thermal system of claim 1, wherein the vapor chamber includes one or more fins located on the region and that extend away from a circuit board, to which the vapor chamber is attached, in order to improve the attenuation of (i) the portion of the first electromagnetic signals that is directed toward the second antenna, and (ii) the portion of the second electromagnetic signals that is directed toward the first antenna.

11. The electro-thermal system of claim 1, wherein the region comprises a part of the vapor chamber that blocks a direct path between the first antenna and the second antenna.

12. The electro-thermal system of claim 1, wherein the other region comprises a part of the vapor chamber that does not block a direct path between the first antenna and the second antenna.

13. An apparatus comprising:
at least one support element;
a first antenna that is mounted at a first location of the at least one support element and a second antenna that is mounted at a second location of the at least one support element; and
a vapor chamber that includes an electromagnetic shielding layer on an outer surface of a region that is positioned between the first antenna and the second antenna to attenuate:
first electromagnetic signals that are emitted by the first antenna toward the second antenna, and
second electromagnetic signals that are emitted by the second antenna toward the first antenna,
wherein the vapor chamber comprises another region that is adjacent to the region and that has a corrosion layer on an outer surface; and
an electronic ground that is in electric contact with the region that is positioned between the first antenna and the second antenna.

14. The apparatus of claim 13, wherein the electromagnetic shielding layer is deposited onto a structural base material in accordance with a predetermined surface treatment that includes:
performing a first surface treatment to remove an oxidation layer from the structural base material at the region of the vapor chamber, and
performing a second surface treatment to deposit a conductive material onto the structural base material at the region of the vapor chamber.

15. The apparatus of claim 14, wherein each of the first surface treatment and the second surface treatment are performed within an inert environment.

16. The apparatus of claim 15, wherein the conductive material has a first resistivity that is at least two times greater than a second resistivity of the structural base material.

17. The apparatus of claim 13, wherein the vapor chamber includes one or more fins that are located at the region, and wherein the one or more fins are electrically grounded.

18. The apparatus of claim 13, wherein the region comprises a part, and not a whole, of the vapor chamber that blocks a direct path between the first antenna and the second antenna.

19. The apparatus of claim 13, wherein the vapor chamber includes one or more fins located on the region and that extend away from the at least one support element in order to improve the attenuation of the first electromagnetic signals that are emitted by the first antenna toward the second antenna and the second electromagnetic signals that are emitted by the second antenna toward the first antenna.

20. The apparatus of claim 13, wherein the other region comprises a part of the vapor chamber that does not block a direct path between the first antenna and the second antenna.

* * * * *